United States Patent [19]

Chaki

[11] Patent Number: 4,512,204
[45] Date of Patent: * Apr. 23, 1985

[54] PUSHBUTTON-OPERATED WAVEBAND OR STATION SELECTOR

[75] Inventor: Takao Chaki, Tokyo, Japan

[73] Assignee: Clarion Co., Ltd., Tokyo, Japan

[*] Notice: The portion of the term of this patent subsequent to Mar. 12, 2002 has been disclaimed.

[21] Appl. No.: 361,608

[22] Filed: Mar. 25, 1982

[30] Foreign Application Priority Data

Mar. 31, 1981 [JP] Japan ................................ 56-46043[U]

[51] Int. Cl.³ .......................... H03J 5/06; F16H 35/18
[52] U.S. Cl. .................................... 74/10.33; 74/10.8; 334/7
[58] Field of Search .................... 74/10.33, 10.37, 10.8, 74/110; 334/7

[56] References Cited

U.S. PATENT DOCUMENTS 2,503,121 4/1950 Mills .................................... 74/10.33
4,204,179 5/1980 Kataoka et al. ..................... 74/10.33

Primary Examiner—Lawrence J. Staab
Attorney, Agent, or Firm—Russell E. Hattis

[57] ABSTRACT

A pushbutton-operated waveband or station selector which comprises a tuning axis having a tuning knob and rotatably-mounted on a tuning axis mounting plate, an idler plate driving gear rotatably mounted on the plate, an idler roller or gear disposed between the tuning axis and the idler plate driving gear for transmitting rotation of the tuning axis to the idler plate driving gear; the idler roller or gear is rotatably mounted on a clutch lever operatively coupled on a kick arm and the idler plate driving gear is in meshing engagement with a rack gear of an idler plate operatively coupled on a core slide.

2 Claims, 4 Drawing Figures

PUSHBUTTON-OPERATED WAVEBAND OR STATION SELECTOR

BACKGROUND OF THE INVENTION

1. Field of the Invention

This invention relates to a pushbutton-operated waveband or station selector and more particularly to improvements in a clutch mechanism to be provided between a core slide operatively connected to a memory plate slidable in response to pushing operation of each pushbutton and a manually-operated tuning knob.

2. Description of the Prior Art

There is a thin pushbutton-operated waveband or station selector wherein a pushbutton tuning portion is less than 1 cm thick. Such thin station selector is so arranged to shift a memory plate over a predetermined distance to a direction of the selector width by pushing a tuning pushbutton to cause front-rear movement of a core slide connected to the memory plate so that a tuning core mounted on the core slide enters in or gets out of a coil to perform tuning operation. A manually-operated tuning knob is further provided in addition to the tuning mechanism by pushbuttons for shifting the core slide in front-rear direction by rotating the tuning knob to select a station which is not set in pushbuttons or for doing fine adjustment upon tuning by pushbuttons.

However, if leaving the tuning knob and the core slide as being connected to each other, when a pushbutton is depressed, the memory plate comes to rotate the tuning knob, too, which means increase of load preventing smooth pushing operation of pushbuttons. In this connection, it has been proposed to provide a clutch mechanism between the tuning knob and the core slide so as to let out the clutch to reduce the load.

As stated above, a pushbutton-operated waveband or station selector comprises a tuner including cross arms for pushbuttons and a memory plate, a tuning section having tuning coils and a core slide, a manually-operated tuning knob and a clutch mechanism coupled with the tuning knob. Among those, the tuning section cannot be miniaturized smaller than a certain size due to sizes of tuning coils and cores for being inserted into the tuning coils or to inserting strokes of the cores. Pushbuttons and a memory plate operatively connected to the pushbuttons can today be made relatively thin. Therefore, in order to further miniaturize and thin such station selector, it is necessary to make small other portions, particularly its clutch mechanism. Additionally, on miniaturizing the clutch mechanism, special attention should be paid so that operational force from the tuning knob may surely be transmitted to the core slide, the cores may smoothly move and stop at determined positions inside the tuning coils. Further, when the pushbutton is depressed, the clutch has to be perfectly let out so that no load is applied from the tuning knob.

However, conventionally proposed clutch mechanisms include so many parts to prevent miniaturization and thinning thereof and to cause difficulty of mounting them. Further, in the conventional clutch mechanisms, there have often seen large loss of power transmission between tuning knobs and core slides to cause instability of shifting positions of cores inside tuning coils, resulting in frequency deviation during tuning operation.

OBJECT OF THE INVENTION

Accordingly, the present invention has an object to overcome the above-mentioned drawbacks of the conventional thin-type pushbutton-operated waveband or station selector, by providing a novel clutch mechanism of a pushbutton-operated waveband or station selector constructed by less parts and permitting miniaturization and thinning of the whole body of the station selector.

SUMMARY OF THE INVENTION

In accordance with the present invention, there is provided a pushbutton-operated waveband or station selector which comprises:

a first member movable in accordance with the pushing force of a pushbutton of said pushbutton-operated waveband or station selector;

a second member for shifting a tuning core to a direction different from that of said first member;

a third member movable in accordance with operation of a tuning knob of said station selector;

a link member having arms for engaging with said first, second and third members and pivotally disposed in said station selector;

a clutch mechanism for coupling the axis of said tuning knob and said third member;

said clutch mechanism being so arranged to uncouple said tuning knob axis and said third member in response to advance of said pushbutton; and said first and third members being movable in a direction of said station selector width.

DETAILED DESCRIPTION OF THE PREFERRED EMBODIMENT

Figure 1:
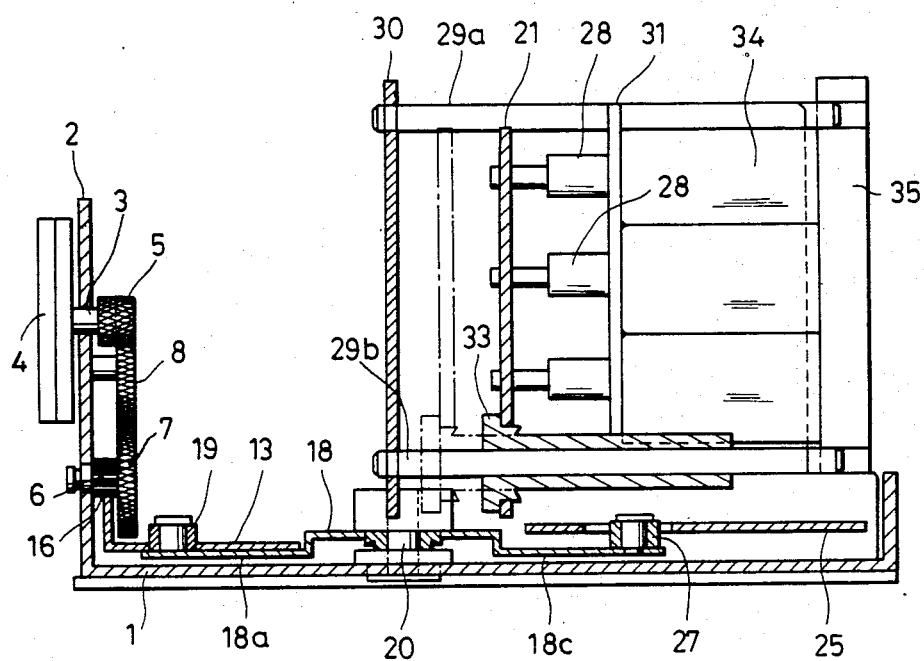
FIG. 1 shows a sectional view illustrating portions of the tuning axis and the core slide of the station selector in which the clutch mechanism according to the present invention is adopted.
Figure 2:
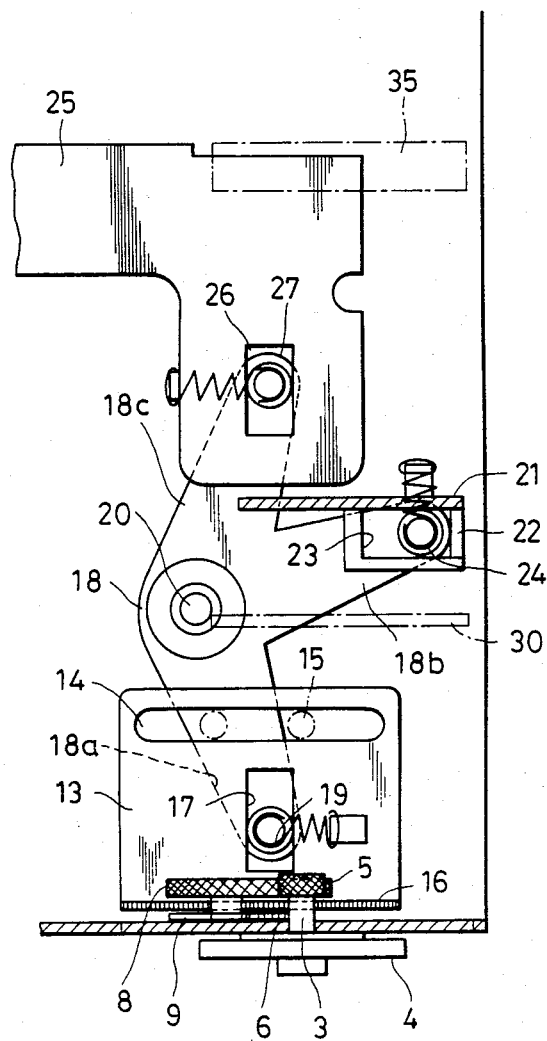
FIG. 2 shows a plan view of the embodiment in FIG. 1.

The present invention will now be described in detail referring to the preferred embodiment illustrated in the drawings.

FIGS. 1 through 4 show an embodiment in which the present invention is adopted in a conventional pushbutton-operated waveband or station selector or tuner, illustrating a kick arm 12 and memory plate 25 and the clutch mechanism of the present invention; a detailed illustration and explanation of the kick arm, memory plate and other conventionally known mechanisms of the pushbutton-operated waveband or station selector are omitted.

Figure 3:
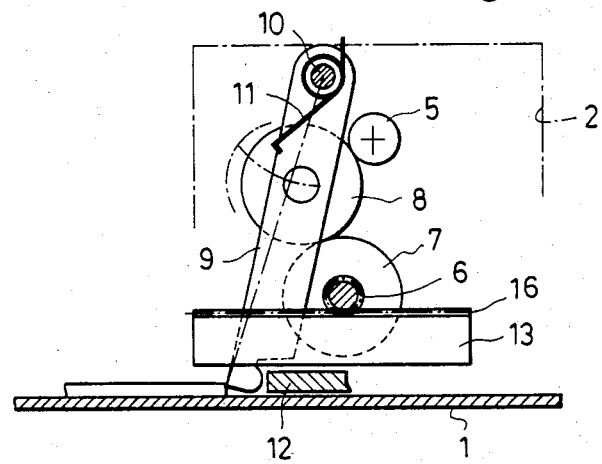
FIG. 3 shows a front view illustrating the portion of the clutch mechanism.

In the drawings, the reference numeral 1 denotes a bottom plate of the apparatus, and 2 a tuning shaft mount plate made of a front vertical rising portion of this bottom plate 1. In the tuning shaft mount plate 2 rotatably fitted is a tuning shaft 3 at the front end of which tuning knob 4 is fixed. The rear end of the tuning knob 4 is protruded to the rear side of the mount plate 2. A frictional wheel 5 is fixed to the protrusion of the tuning knob 4. Below the tuning shaft 3 of the mount plate 2 rotatably mounted is an idler plate drive gear 6 at the rear end of which another frictional wheel 7 secured in spaced relation to the frictional wheel 5 of said tuning shaft 3. An idler roller 8 is disposed between the two frictional wheels 5 and 7 as to couple the wheel 5 to the wheel 7. This idler roller 8 is rotatably installed on a clutch lever 9 as shown in FIG. 3. The clutch lever 9 is pivotably mounted at the upper end thereof on a pivotal shaft 10 provided on the tuning shaft mount plate 2, and is always forced to the side of tuning shaft 3 by a torsion spring 11 provided on the pivotal shaft so that the idler roller 8 provided on the clutch lever 9 is forced on the frictional wheels 5 and 7. The lower end of the clutch lever 9 is extended to a position near the bottom plate 1 of the apparatus. A kick arm 12 engages at the lower end of the clutch lever 9. As the pushbutton is depressed, the kick arm 12 is moved transversely over the bottom plate 1 where the kick arm 12 will force the clutch lever 9 against the force of spring 11 in a direction as to remove roller 8 from engagement with wheels 5 and 7. There is provided at the rear of the tuning shaft mount plate 2 an idler plate 13 which is guided by a guide hole 14 extending across the idler plate and by a pin 15 inserted in the guide hole 14 to move reciprocally in the direction of the apparatus width. The idler plate 13 has formed at the front edge thereof a rack gear 16 facing upward and which is in mesh with said idler plate drive gear 6.

The clutch mechanism according to the present invention is constructed as mentioned above and is connected to other portions of the station selector in the following manner.

The idler plate 13 has formed therein a guide hole 17 extending longitudinally, in which rotatably fitted is a guide roller 19 provided at the end of the first arm 18a of a three-armed link 18 (FIG. 1).

The three-armed link 18 is rotatably mounted on a pivotal shaft 20 fixed to the bottom plate 1, and has three arms (FIG. 2) which are protruded frontward, rearward and laterally, respectively, of the apparatus about the pivotal shaft 20. The first arm 18a is protruded frontward of the apparatus as mentioned above, and has provided at the free end thereof a guide roller 19 which is fitted in the guider hole 17 in the idler plate 13; the second arm 18b of the link 18 is protruded laterally of the apparatus, and has a free end on which a core slide 21 engages. The core slide 21 has provided at the lower end thereof a horizontal coupling plate 22 in which formed is a guide hole 23 extending in the direction of apparatus width and in which a guide roller 24 provided at the end of the second arm 18b is rotatably fitted. The third arm 18c of the link 18 is projecting rearward of the apparatus and has coupled at the end thereof a memory plate 25 in which formed is a guide hole 26 extending longitudinally. A guide roller 27 provided at the end of the third arm 18c is rotatably fitted in the guide hole 26. Similar to the memory plate in the conventional thin tuning apparatus, the memory plate 25 is moved laterally of the apparatus over a distance corresponding to the position of the setting plate provided to each of the pushbuttons when the button is depressed.

Figure 4:
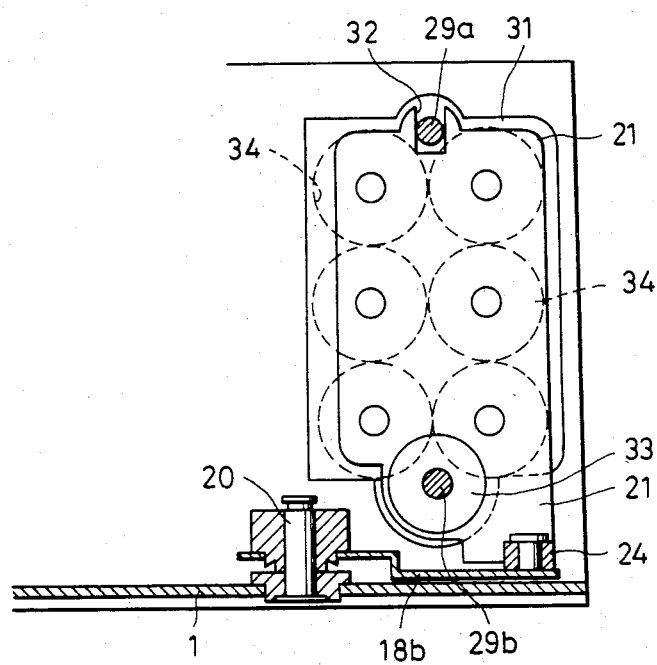
FIG. 4 shows a front view illustrating the portion of the core slide.

Said core slide 21 is disposed vertically in the pushbutton-operated waveband or station selector; it has horizontally installed at the rear thereof six cores 28, for example; the core slide 21 is slidably installed on the two upper and lower guide shafts 29a and 29b disposed in front-rear direction of the apparatus. These guide shafts 29a and 29b are so installed between a guide shaft mount plate 31 disposed in front of the core slide 21 and a coil mount plate 31 disposed at the back of the core slide 21 as to bridge the mount plates 30 and 31. Further, a concave portion 32 is formed in the upper center of the core slide 21 as shown in FIG. 4, and the upper guide shaft 29a is slidably fitted in the concave portion 32. The core slide 21 has fixed at the lower portion thereof a guide pipe in the front-rear direction of the apparatus. The lower guide shaft 29b is slidably fitted in the guide pipe 33.

There are fixed at the rear of the previously-mentioned coil mount plate 31 tuning coils 34 (FIG. 1) horizontally in correspondence with the cores 28 which are so inserted in the respective tuning coils 34 as to be moved in front-rear direction. The rear ends of these tuning coils 34 abut on a terminal board 35 for connection of the coil lead of each tuning coil. The tuning coils 34 are supported by the coil mount plate 31 and the terminal board 35 from the front and rear, respectively.

The clutch mechanism according to the present invention and the pushbutton-operated waveband or station selector adopting the clutch mechanism are constructed as mentioned in the above, and function as described below:

For selection of a station or waveband by operating the manual tuning knob 4, the knob 4 is turned to rotate the frictional wheel 5 provided at the end of the tuning shaft 3. Since the idler roller 8 is in forced contact with and between the frictional wheel 5 and the frictional wheel 7 of the idler plate drive gear 6, the rotation of the frictional wheel 5 is transmitted through the idler roller 8 to the frictional wheel 7, thus the idler plate drive gear 6 is rotated. Then, the idler plate 13 in mesh with the idler plate drive gear 6 by means of the rack gear 16 is moved in lateral direction to force the first arm 18a of the link 18 in the lateral direction. As the result, the link 18 pivots about the pivotal shaft 20 so that the end of the second arm 18b of the link 18 is moved in the front-rear direction of the apparatus. Since the core slide 21 is coupled with the end of the second arm 18b of the link by means of the guide hole 23 and guide roller 24, the core slide 21 is moved in the front-rear direction under the guidance of the guide shafts 29a and 29b. Then, the core 28 installed at the rear side of the core slide 21 is also moved in the front-rear direction so that the inserted position of the core inside the tuning coil 34 is changed; thus, the inductance of the tuning coil 34 is so changed as to provide a tuning with a waveband or station. At the same time, the third arm 18c of the link 18 is moved in the opposite direction so that the memory plate 25 coupled with the end of the third arm 18c is also moved in the lateral direction and stopped at a position corresponding to the inserted position of the core.

On the contrary, when a pushbutton corresponding to a desired station or waveband is depressed, the kick arm 12 is moved as interlocked with the depression of the button and forces the clutch lever 9 against the action of the torsion spring 11 in the opposite direction to the tuning shaft 5. As the result, the idler roller 8 mounted on the clutch lever 9 leaves the frictional wheels 5 and 7 so that the idler rack drive gear 6 and the frictional wheel 7 are freely rotatable as not limited by the tuning shaft 3.

When the memory plate 25 is forced by the setting pin provided in the pushbutton in this condition, the plate 25 is moved in the lateral direction. Then, the third arm 18c of the link 18 coupled with the memory plate 25 by means of the guide hole 26 and guide roller 27 is forced in the lateral direction so that the link 18 is pivoted about the pivotal shaft 20. The end of the second arm 18b of the link 18 is moved in the front-rear direction, thus also the core slide 20 coupled with the end of this arm is moved in the front-rear direction so that the inserted position of the core 28 inside the tuning coil 34 is changed, thus providing a tuning with a desired or selected station or waveband. In this case, since the first arm 18a of the link 18 is coupled with the idler plate 13, also this idler plate 13 is moved in the opposite direction to the memory plate 25. In this case, however, the idler plate 13 will rotate the idler plate drive gear 6 only, not the idler roller 8 and tuning shaft 3. Therefore, the idler plate 13 is smoothly moved and the link 18, core slide 21 and the memory plate 25 coupled with the idler plate 13 are smoothly moved.

It should be noted that, the present invention is not limited to the embodiment having been illustrated in the drawings; for example, idler gears may be used instead of the frictional wheels and idler rollers for power transmission between the tuning axis and idler plate. Further, as to interlocking mechanisms between the idler plate, core slide and memory plate, also, a conventionally one adopted in such station selector for operatively connecting such memory plate and core slide may be used instead of the three-armed link.

As having been described in the foregoing, the clutch mechanism according to the present invention is so simply constructed that, by mounting idler rollers or gears on the clutch lever operatively connected to the kick arm, the idler rollers, etc. are only pressed to or separated from the tuning axis and the idler plate driving gears. Therefore, number of the parts for constructing the clutch mechanism is remarkably reduced as compared with the conventional clutch mechanism permitting simplification, miniaturization and thinning of the station selector. Further, since the clutch is let out at the time of pushbutton operation only by shifting the clutch lever, force required for depressing pushbuttons can be reduced. Particularly when letting out the clutch by separating idler rollers or gears therefrom, the idler rollers or gears do not apply a strong impulse to the idler plate and the driving gears, thus preventing undesirable play of the idler plate. Therefore, problems like instability of the stop position of the core slide and frequency deviation can be overcome. Further, when the clutch comprises the frictional wheels and idler rollers as illustrated in the drawings, space for shifting the clutch lever may be reduced because the clutch is let out by shifting idler rollers only a small width.

I claim:

1. In a tuner having a pushbutton-operated waveband or station selector in which the tuner has pushbuttons for making station selections, a rotatable tuning knob for making station selections alternatively with the pushbuttons, tuning coil means and tuning core means movable in said tuning coil means and operable by the pushbuttons and the tuning knob for tuning in stations, the combination comprising: a slidable memory plate movable back and forth in a first direction between a plurality of positions which are selectable by operation of said pushbuttons, said first direction extending laterally to the direction of movement of the pushbuttons, and a first elongated guide portion on said memory plate and extending perpendicular to said first direction; a slidable core slide connected to the tuning core means and movable back and forth in a second direction for tuning in stations, said second direction being different from said first direction, and a second elongated guide portion on said core slide and extending perpendicular to said second direction; a slidable idler plate movable in said first direction in response to rotation of the tuning knob, and a third elongated guide portion on said idler plate and extending perpendicular to said first direction; a link having first, second and third arms and means mounting said link for pivotal movement on said tuner, each of said arms having a guide member thereon spaced outwardly from the pivot axis of said link, the guide member on said first arm being slidably received in said third guide portion, the guide member on said second arm being slidably received in said second guide portion and the guide member on said third arm being slidably received in said first guide portion so that movement of said memory plate or said idler plate in the first direction will pivot the link and thereby effect movement of said core slide in the second direction; and a clutch mechanism for coupling the axis of said tuning knob and said idler plate; said clutch mechanism being so arranged to decouple said tuning knob axis and said idler plate in response to advance of said pushbutton.

2. A pushbutton-operated waveband or station selector as claimed in claim 1 wherein said clutch mechanism comprises a rotatable clutch lever, and an idler roller rotatably mounted on said clutch lever, said idler roller normally coupling said tuning knob axis and said idler plate and said clutch lever rotating in response to advance of said pushbutton to thereby rotate said idler roller so as to decouple said tuning knob axis and said idler plate.

* * * * *